US007776757B2

(12) United States Patent
Lin et al.

(10) Patent No.: US 7,776,757 B2
(45) Date of Patent: Aug. 17, 2010

(54) METHOD OF FABRICATING HIGH-K METAL GATE DEVICES

(75) Inventors: Simon Su-Horng Lin, Hsinchu (TW); Yu-Ming Lee, Taichung (TW); Shao-Yen Ku, Jhubei (TW); Chi-Ming Yang, Hsian-San District (TW); Chyi-Shyuan Chern, Taipei (TW); Chin-Hsiang Lin, Hsin Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/354,394

(22) Filed: Jan. 15, 2009

(65) Prior Publication Data

US 2010/0178772 A1 Jul. 15, 2010

(51) Int. Cl.
*H01L 21/302* (2006.01)
(52) U.S. Cl. .................. 438/746; 438/694; 438/216; 438/287; 257/E21.224; 257/E21.228
(58) Field of Classification Search ................ 438/656, 438/685, 482, 488, 657, 746, 756, 906, 694; 257/E21.091, E21.269, E21.216, E21.224, 257/E21.228
See application file for complete search history.

(56) References Cited

U.S. PATENT DOCUMENTS

| | | | | |
|---|---|---|---|---|
| 5,770,515 A | * | 6/1998 | Meng et al. ............... 438/592 |
| 6,057,557 A | * | 5/2000 | Ichikawa ................ 257/59 |
| 6,153,465 A | * | 11/2000 | Jenq et al. ................ 438/255 |
| 6,420,260 B1 | * | 7/2002 | Ngan et al. .............. 438/627 |
| 2007/0178646 A1 | * | 8/2007 | Ramaswamy et al. ..... 438/269 |
| 2009/0029538 A1 | * | 1/2009 | Taylor et al. ............. 438/592 |
| 2009/0256261 A1 | * | 10/2009 | Noguchi et al. ........... 257/760 |

OTHER PUBLICATIONS

Ghandhi, S.K., VLSI Fabrication Principles, Silicon and Gallium Arsenide1983 by John Wiley and Sons, Inc., pp. 517-519.*

* cited by examiner

*Primary Examiner*—Julio J Maldonado
(74) *Attorney, Agent, or Firm*—Haynes and Boone, LLP

(57) ABSTRACT

The present disclosure provides a method for fabricating a semiconductor device. The method includes providing a semiconductor substrate having a first region and a second region, forming a high-k dielectric layer over the semiconductor substrate, forming a first metal layer and a first silicon layer by an in-situ deposition process, patterning the first silicon layer to remove a portion overlying the second region, patterning the first metal layer using the patterned first silicon layer as a mask, and removing the patterned first silicon layer including applying a solution. The solution includes a first component having an [F-] concentration greater than 0.01M, a second component configured to adjust a pH of the solution from about 4.3 to about 6.7, and a third component configured to adjust a potential of the solution to be greater than −1.4 volts.

21 Claims, 10 Drawing Sheets

METHOD OF FABRICATING HIGH-K METAL GATE DEVICES

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. Metal-oxide semiconductor (MOS) transistors have typically been formed with polysilicon gate electrodes. There has been a desire to fabricate these devices with a metal material for the gate electrode and a high-k dielectric for the gate dielectric. However, problems have arisen due to several factors such as incompatibility of materials, photoresist peeling, oxidation of material layers, and process complexity.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Illustrated in FIGS. 1A to 1G are cross-sectional views of a semiconductor device 100 at various stages of fabrication. It is understood that FIGS. 1A to 1G have been simplified for a better understanding of the inventive concepts of the present disclosure. The semiconductor device 100 may be an integrated circuit, or portion thereof, that may comprise static random access memory (SRAM) and/or other logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor device 100 may be fabricated with a CMOS process flow but are not illustrated for the sake of clarity.

Figure 1A:
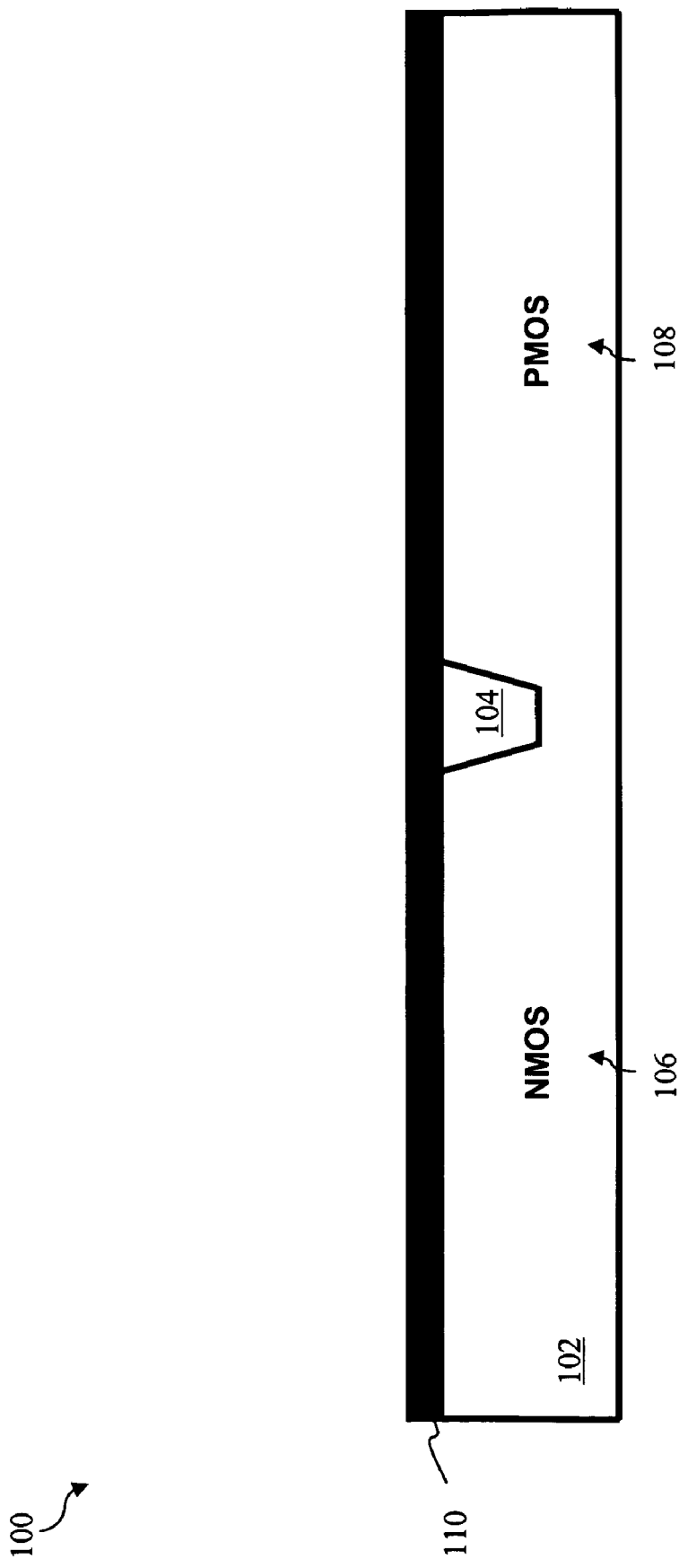
FIGS. 1A to 1G are cross-sectional views of a semiconductor device being fabricated with a high-k dielectric and metal gate.

Referring to FIG. 1A, the semiconductor device 100 includes a substrate 102. In the present embodiment, the substrate 102 includes a silicon substrate (e.g., wafer) in a crystalline structure. The substrate 102 may include various doping configurations depending on design requirements as is known in the art (e.g., p-type substrate or n-type substrate). Additionally, the substrate 102 may include various doped regions such as p-type wells (p-wells) or n-type wells (n-wells). The substrate 102 may also include other elementary semiconductors such as germanium and diamond. Alternatively, the substrate 102 may include a compound semiconductor such as, silicon carbide, gallium arsenide, indium arsenide, or indium phosphide. Further, the substrate 102 may optionally include an epitaxial layer (epi layer), may be strained for performance enhancement, and may include a silicon-on-insulator (SOI) structure.

The semiconductor device 100 further includes isolation structures such as shallow trench isolation (STI) features 104 formed in the substrate 102 to isolate one or more devices from each other. In the present embodiment, the STI feature 104 isolates an active region that is configured for an NMOS device 106 (e.g., nFET) and an active region that is configured for a PMOS device 108 (e.g., pFET). The STI features 104 may include silicon oxide, silicon nitride, silicon oxynitride, fluoride-doped silicate (FSG), and/or a low-K dielectric material known in the art. Other isolation methods and/or features are possible in lieu of or in addition to STI. The STI features 104 may be formed using processes such as reactive ion etch (RIE) of the substrate 102 to form trenches which are then filled with an insulator material using deposition processes followed by a chemical-mechanical-polishing (CMP) process.

The semiconductor device 100 further includes an interfacial layer formed on the substrate 102. The interfacial layer may include silicon oxide (e.g., thermal oxide or chemical oxide). The interfacial layer may include a thickness ranging from about 5 angstroms and about 20 angstrom (A). The interfacial layer may be formed by atomic layer deposition (ALD), chemical vapor deposition (CVD), physical vapor deposition (PVD or sputtering), thermal oxidation, or combinations thereof. Alternatively, the interfacial layer may optionally include silicon oxynitride (SiON).

The semiconductor device 100 further includes a high-k dielectric layer 110 formed over the interfacial layer. The high-k dielectric layer 110 is formed by ALD, CVD, metal-organic CVD (MOCVD), PVD, thermal oxidation, combinations thereof, or other suitable techniques. The high-k dielectric layer 110 may include a thickness ranging from about 5 to about 20 angstrom (A). The high-k dielectric layer 110 may include a binary or ternary high-k film. In the present embodiment, the high-k dielectric layer 110 includes hafnium oxide ($HfO_2$) or hafnium oxide based high-k dielectric materials. Alternatively, the high-k dielectric layer 110 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials.

In some embodiments, a capping layer is optionally formed on the high-k dielectric layer 112 for tuning an effect work function of the NMOS device 106 and/or PMOS device 108. For example, a capping layer such as lanthanum oxide ($La_2O_3$) may be formed in the NMOS device 106 side and a capping layer such as aluminum oxide ($Al_2O_3$) may be formed in the PMOS device 108 side. The capping layer may include a thickness ranging from about 3 to about 20 angstrom. In other embodiments, multiple capping layers may be implemented to adjust the work function of the NMOS device 106 and PMOS device 108.

Figure 1B:
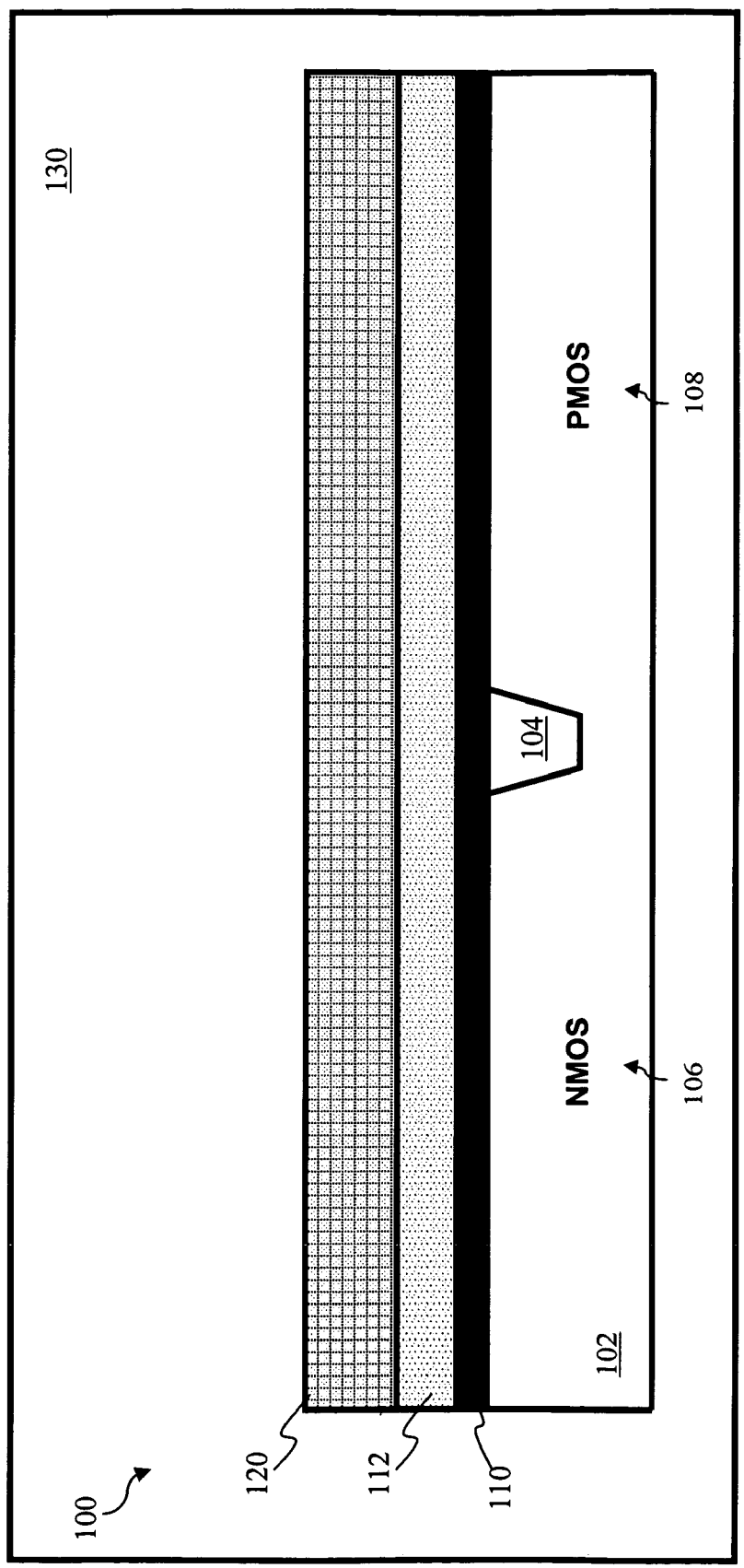

In FIG. 1B, the semiconductor device 100 further includes a metal layer 112 formed over the high-k dielectric layer 110. In the present embodiment, the metal layer 112 is formed of TiN. Alternatively, the metal layer 112 may optionally include other metal materials such as MoN, WN, and TaN. The semiconductor device 100 further includes a hard mask layer 120 formed over the metal layer 112. The hard mask layer 120 may be formed of silicon (e.g., polysilicon or amorphous silicon). In the present example, the metal layer 112 and the hard mask layer 120 are formed in-situ 130. In other words, the metal layer 112 and the hard mask layer 120 are formed in a same vacuum platform without being exposed to the atmosphere. For example, the metal layer 112 and the hard mask 120 may be formed utilizing an in-situ PVD tool. In some embodiments, the in-situ PVD tool may include two chambers within a vacuum platform. Accordingly, a substrate may be transported from one chamber to the other chamber without being exposed to the outside environment. One chamber may be operable to form the metal layer 112 and the other chamber may be operable to form the hard mask layer 120. In other embodiments, the in-situ PVD tool may include a single chamber that is operable to form both the metal layer 112 and hard mask layer 120. Accordingly, different targets may be selected and provided to the same chamber for forming the different material layers.

In the present embodiment, the TiN metal layer may be formed with the following process parameters: a Ti target, a DC power not exceeding 1000 W (e.g., 1000 W), an RF power not exceeding 1000 W (e.g., 800 W), Ar having a flow rate not exceeding 100 sccm (e.g., 0-20 sccm), and $N_2$ having a flow rate not exceeding 100 sccm (e.g., 10-80 sccm). The TiN metal layer may include a thickness ranging from about 10 to about 100 angstrom. It is understood that the target may optionally include Mo, W, or Ta to form the other materials of the metal layer 112 (e.g., MoN, WN, TaN). The hard mask layer 120 may be formed with the following process parameters: a Si target, a DC power not exceeding 1000 W (e.g., 1000 W), an RF power not exceeding 1000 W (e.g., 800 W), and Ar having a flow rate not exceeding 100 sccm (e.g., 0-20 sccm). The PVD process may provide a good uniform hard mask layer 120. The hard mask layer 120 may include a thickness not exceeding 100 angstrom (e.g., 50 angstrom). It has been observed that by providing a thin hard mask, polymer residues (due to oxidation) left behind following removal of the hard mask may be minimized. Further, the hard mask layer 120 may be doped or un-doped during the deposition process. It is understood that other inert or inactive gases may be used instead of Ar gas, and that the specified parameters may be adjusted depending on a particular tool used and design requirements of the semiconductor device.

The metal layer 112 is removed in the PMOS device 108 side for N/P metal patterning. That is, the metal layer 112 is removed so that a P-type work function metal (P-metal) may be formed in the PMOS device 108 side to properly perform and achieve a desired threshold voltage. Although the present example discloses N/P metal patterning to form a P-metal, it is understood that an N-type work function metal (N-metal) in the NMOS device 106 side may also be formed in a similar manner without departing from the spirit and scope of the present disclosure.

Figure 1C:
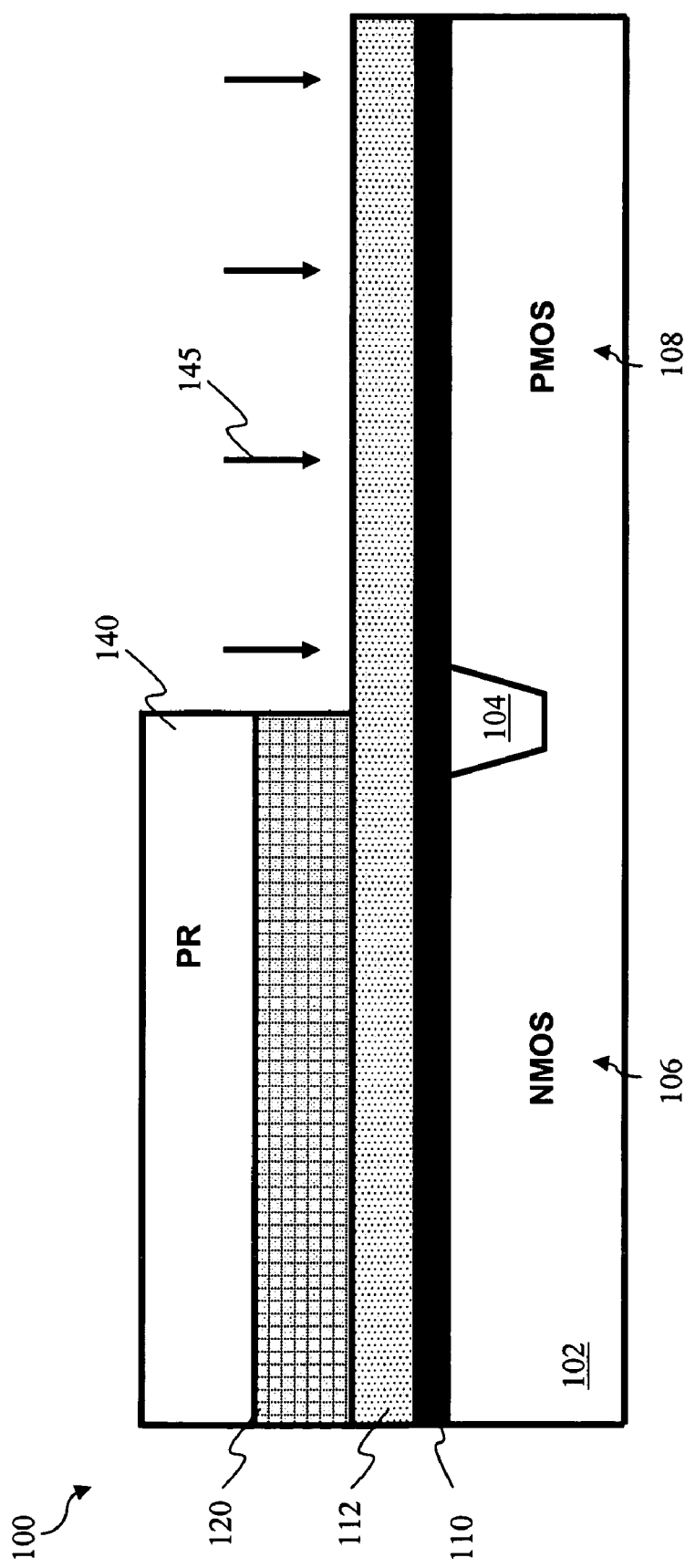

In FIG. 1C, the hard mask layer 120 is patterned by forming a patterned photoresist layer 140 and then etching the hard mask layer using the photoresist layer as a mask. The photoresist layer 140 may be formed by photolithography, immersion lithography, ion-beam writing, or other suitable process. In one embodiment, the photolithography process includes spin coating, soft-baking, exposure, post-baking, developing, rinsing, drying, and other suitable process. The hard mask layer 120 in the PMOS device 108 side are removed by a dry etching process 145. The dry etching process 145 may utilize the following process parameters: F or Cl containing gases (e.g., $SF_6$, $Cl_2$, $BCl_3$), a power not exceeding 2000 W (e.g., 1500-2000 W), and a temperature ranging from about 180 to about 250 degree C. The dry etching process 145 may use the metal layer 112 as an etch stop layer, or may over-etch and remove a portion of the metal layer 112 in the PMOS device 108 side.

In some embodiments, the photoresist layer 140 may be removed after patterning the hard mask layer 120. For example, the photoresist layer 140 may be removed by a dry ashing process using $N_2/H_2$ gases, a power about 1000 W, and a temperature ranging from about 180 to about 250 degree C. Alternatively, the photoresist layer 140 may be removed by a stripping process that uses a reduction agent or solvent (e.g., non-oxidizing agent or solvent). In other embodiments, the photoresist layer 140 may be removed after patterning the metal layer 112 as discussed below. It should be noted that the dry ashing and stripping processes disclosed above help prevent the risk of oxidizing the sidewalls of the metal layer 112 and hard mask layer 120 that are exposed after patterning.

Figure 1D:
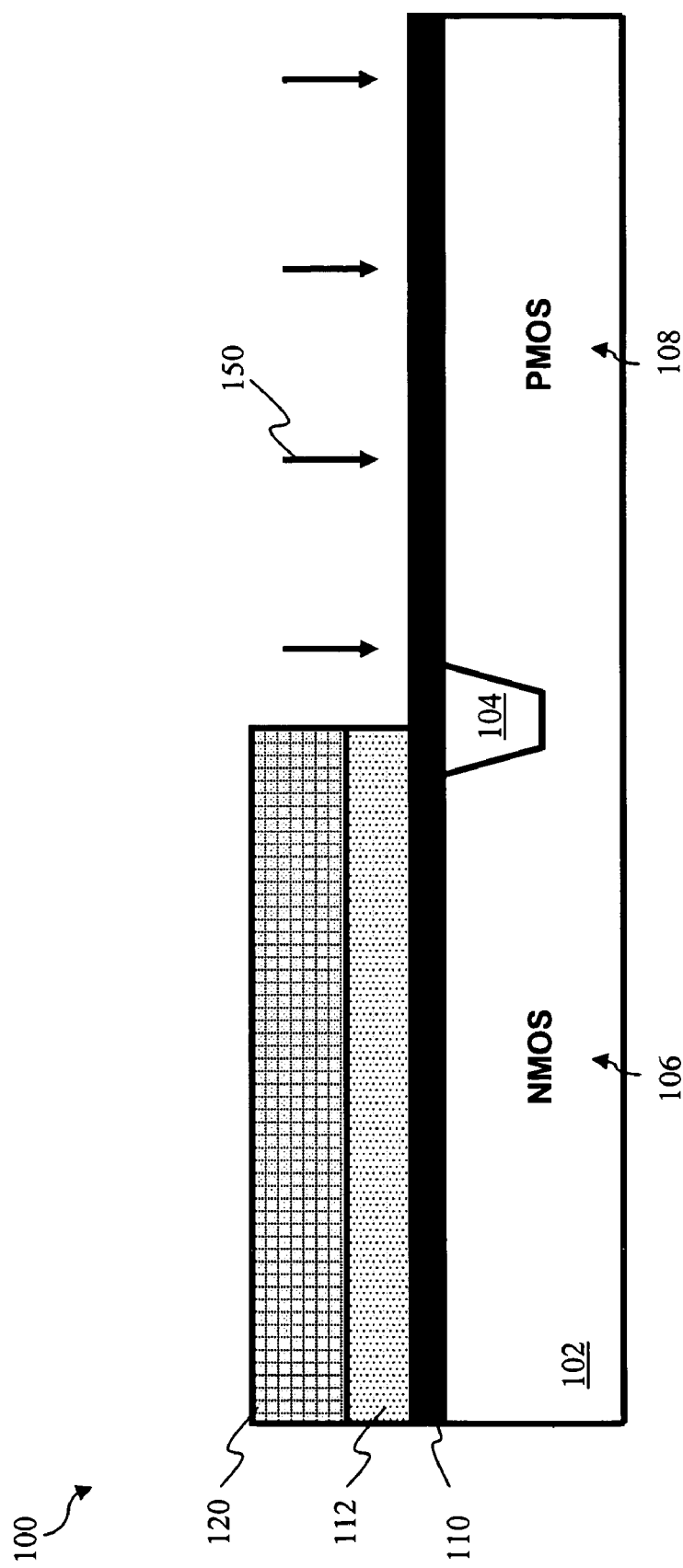

In FIG. 1D, the metal layer 112 in the PMOS device 108 side is then selectively removed by a wet etching, dry etching, or combination wet and dry etching process. The hard mask layer 120 may be used to pattern the metal layer 112 since it better adheres to the metal layer as compared to a photoresist material. Accordingly, the risk of photoresist peeling may be prevented. The hard mask layer 120 may protect the metal layer 112 in the NMOS device 106 side from being removed by the etching process. In the present embodiment, the unprotected metal layer 112 may be removed by a wet etching process 150. The wet etching process 150 may utilize an ammonium peroxide mixture (referred to as APM) or other suitable etching chemical.

Figure 1E:
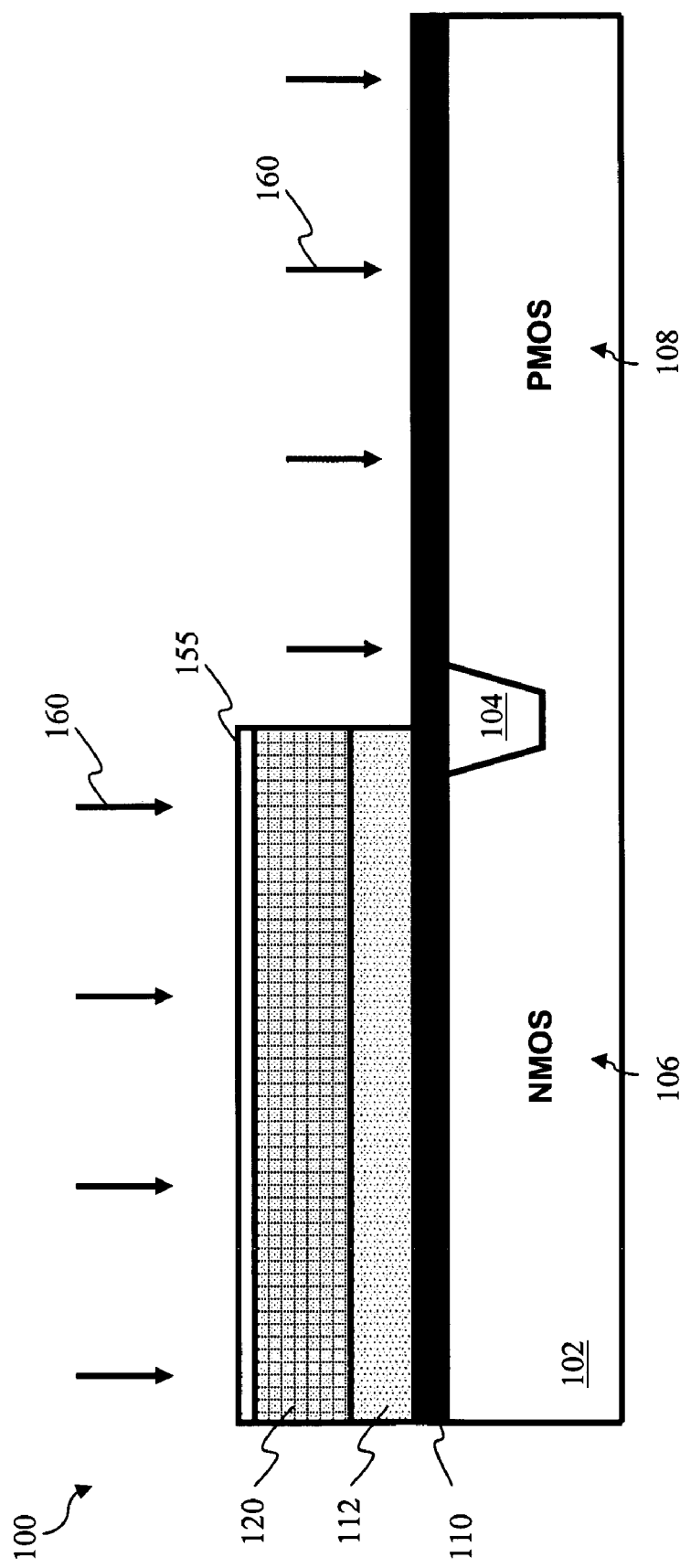

In FIG. 1E, the hard mask layer 120 is removed by an etching process after N/P patterning. It has been observed that a top surface of the hard mask layer 120 may oxidize, and thus a native oxide ($SiO_2$) layer 155 may form over the top surface of the hard mask layer 120. Accordingly, an etching chemical solution, such as an HF solution 160, can be used to remove the native oxide 155. Thereafter, the remaining silicon material of the hard mask layer 120 can be removed by an etching process such as using an etching solution with an amine derivative (e.g., $NH_4OH$, $NH_3(CH_3)OH$, $NH_2(CH_3)_2OH$, $NH(CH_3)_3OH$, $N(CH_3)_4OH$, or combinations thereof) or other suitable etchant.

Figure 1F:
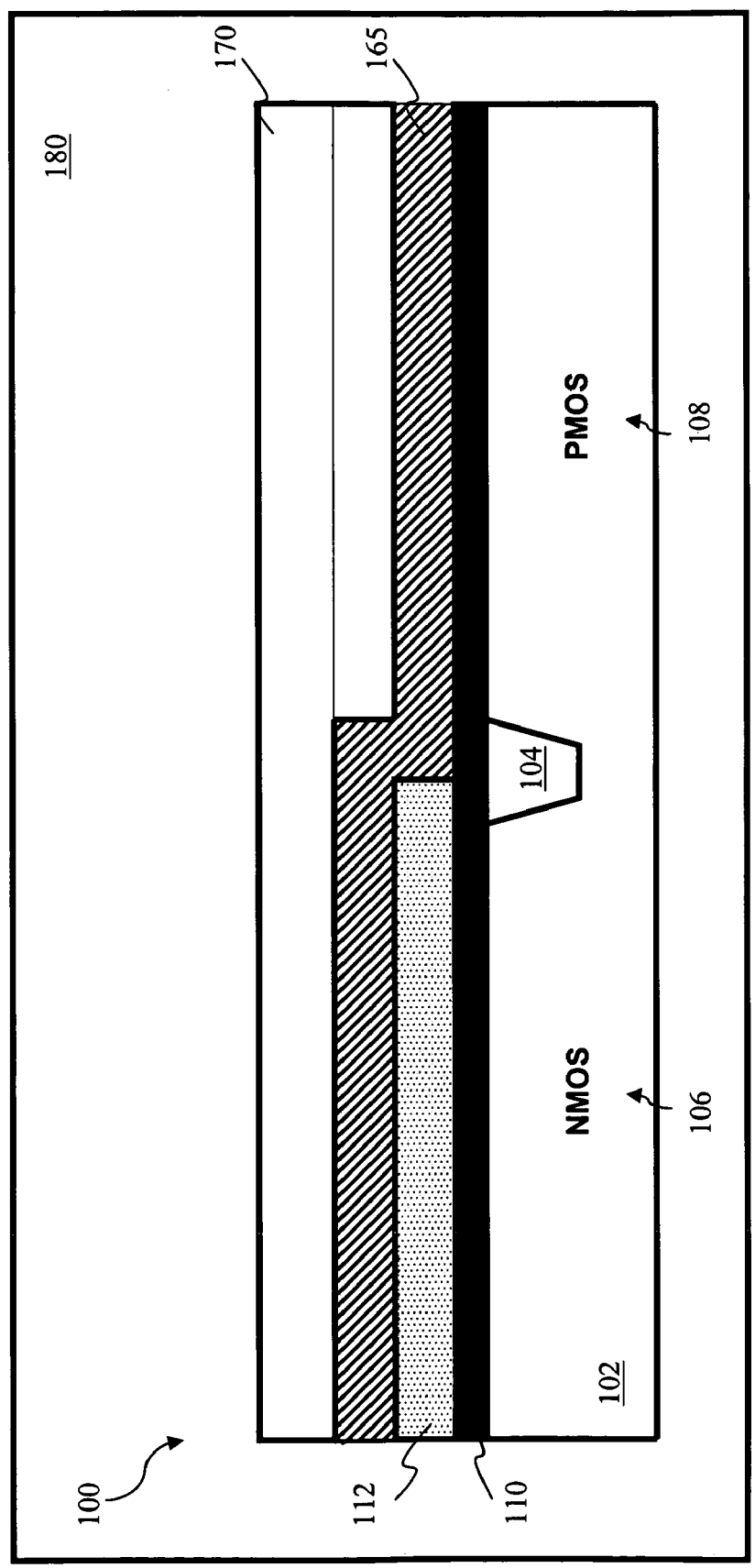

In FIG. 1F, after removing the hard mask layer 120, a metal layer is deposited for forming a metal gate or portion thereof, including work function layers, liner layers, interface layers, seed layers, adhesion layers, barrier layers, etc. In the present embodiment, a P-metal layer 165 is formed over the high-k dielectric layer 110 in the PMOS device 108 side and over the metal layer 112 in the NMOS device 106 side. For example, the P-metal layer 165 may include various metals such as MoN, WN, TaN, or TiN. Additionally, a polysilicon (or poly) layer 170 is formed over the P-metal layer 165. In the present example, the P-metal layer 165 and the poly layer 170 are formed in-situ 180 similar to the in-situ 130 process disclosed above for forming the metal layer 112 and hard mask layer 120. The P-metal layer 165 may include a thickness ranging form about 10 to about 100 angstrom. The poly layer 170 may include a thickness ranging from about 400 to about 800 angstrom. Additionally, the poly layer 170 may be doped during the deposition process since the poly layer 170 may function as part of the gate electrodes of the NMOS device 106 and PMOS device 108, respectively. Alternatively, the poly layer 170 may optionally be doped in a subsequent implantation process or other suitable process when forming various features such as source/drain regions.

Figure 1G:
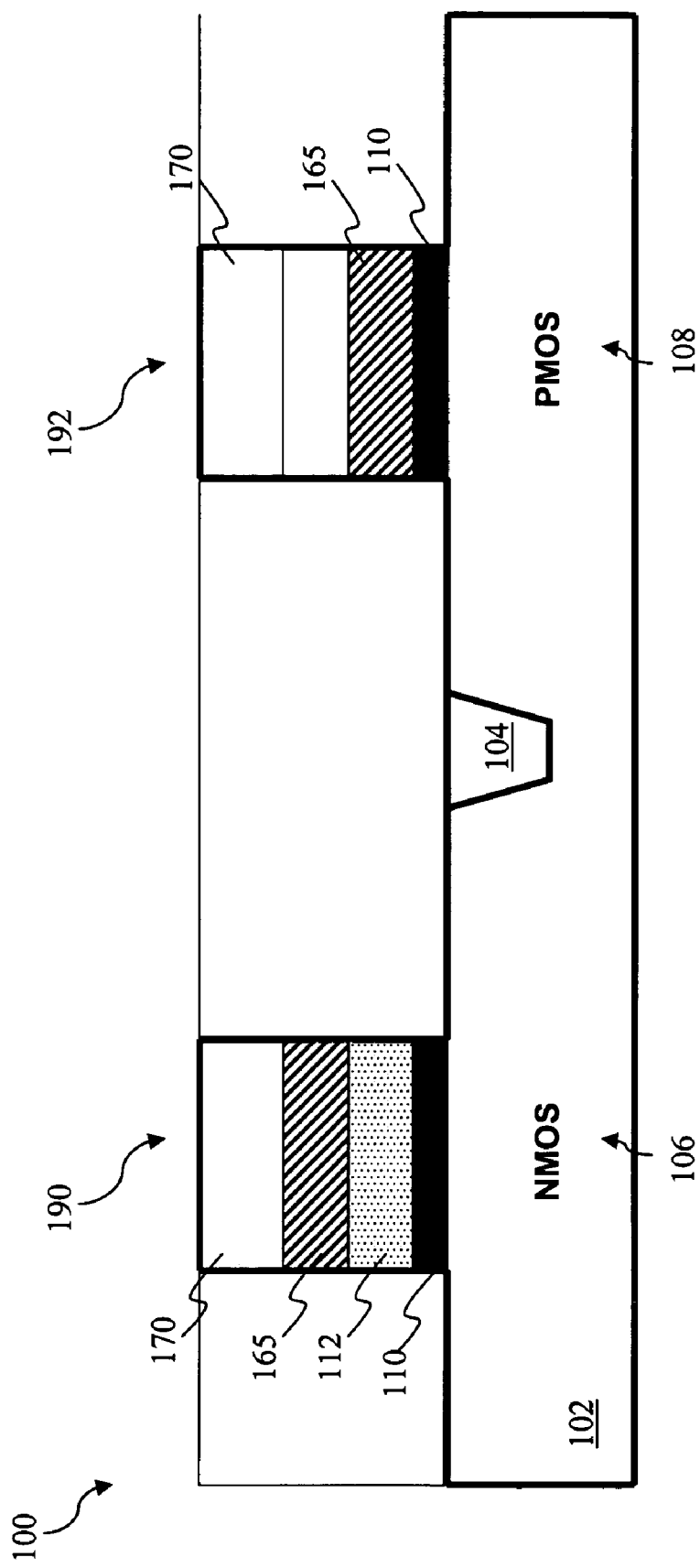

In FIG. 1G, the semiconductor device 100 continues with a CMOS process flow to form various features of the NMOS device 106 and PMOS device 108. For example, a gate patterning/etching process may be performed on the various material layers to form gate structures 190, 192 in the NMOS device 106 side and PMOS device 108 side, respectively. It should be noted that the material layers disposed on the high-k dielectric 110 of the gate structures 190, 192 are mere examples, and that other combinations of capping layers and metal layers may be used. In some embodiments, two capping layers/one metal layer/poly layer may be used. In other embodiments, one capping layer/two metal layers/poly layer may be used. In still other embodiments, no capping layer/two metal layers/poly layer may be used. It is understood that the semiconductor device 100 may undergo further CMOS processing to form other features such as lightly doped source/drain regions, sidewall spacers, heavy doped source/drain regions, silicide features, contact etch stop layer, inter-layer dielectric (ILD), interconnect structures (including vias, contacts, metal layers, and inter-metal dielectric), etc.

It has been observed the HF solution 160 (in FIG. 1E) without the proper electrochemical properties may damage and remove portions of the high-k dielectric layer 110 in the PMOS device 108 side. In other words, the HF solution 160 may not be tuned properly to provide a high etching selectively of silicon oxide to hafnium oxide. Accordingly, the quality and integrity of the high-k dielectric layer 110 may be degraded which can lead to poor device performance and reliability.

Figure 2:
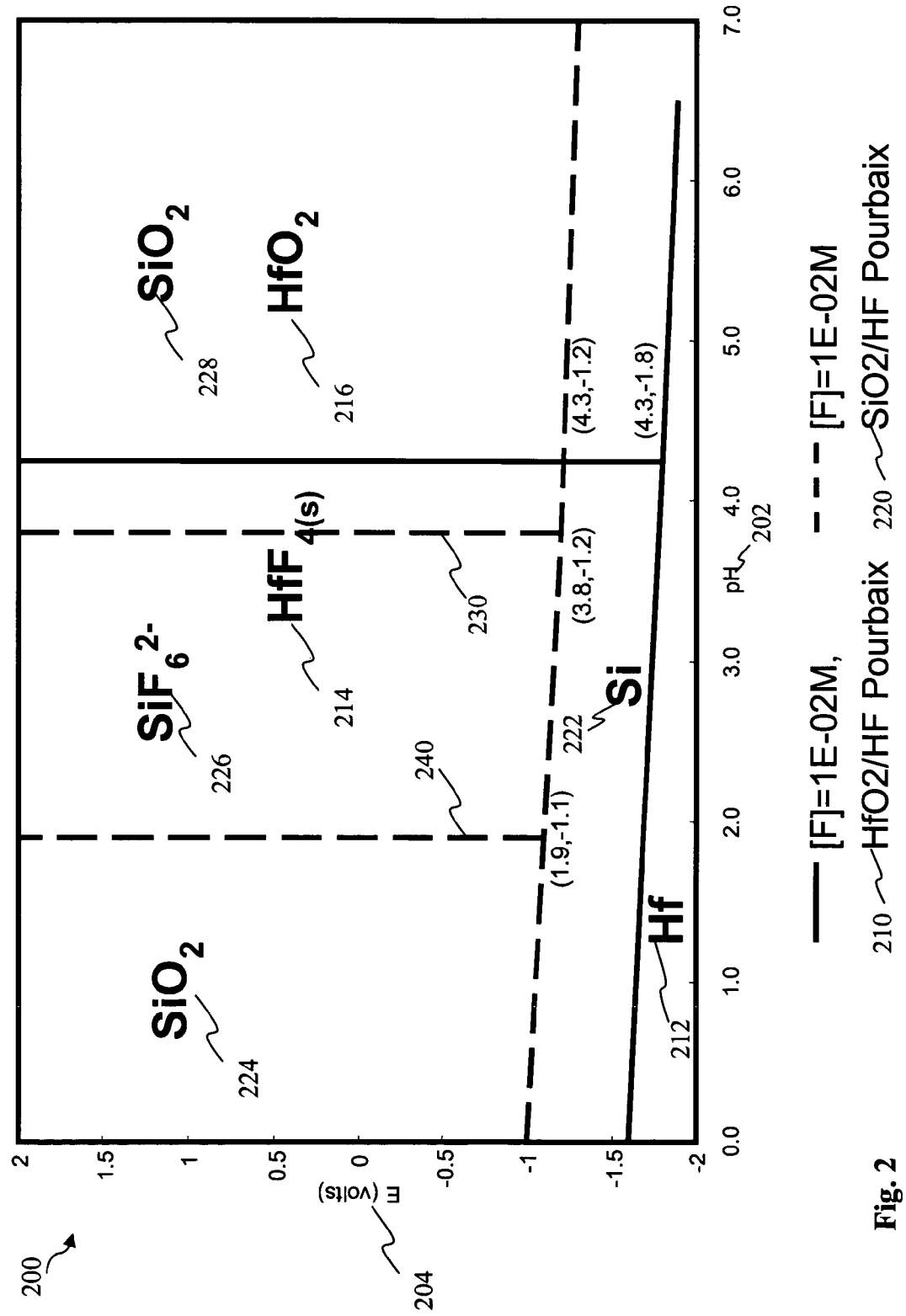
FIG. 2 is a pourbaix diagram illustrating various phases of $HfO_2$ and $SiO_2$, respectively, in HF solution with an [F-] concentration of 0.01M.

Referring to FIG. 2 illustrated is a pourbaix diagram 200 showing various phases of hafnium oxide ($HfO_2$) and silicon oxide ($SiO_2$), respectively, in HF solution having an [F-] concentration of about 0.01M. The diagram 200 includes an x-axis 202 that represents a pH of the chemical system. It is understood that the pH is the -log function of the H+ ion concentration of the chemical system. The diagram 200 further includes a y-axis 204 that represents a voltage potential (E) of the chemical system. The diagram 200 may be referred to as a potential/pH diagram that maps various stable phases of the chemical system. With respect to an $HfO_2$/HF system 210, there are three (3) phases that are shown in the diagram 200. The various phases of the $HfO_2$/HF system 210 include a phase of Hf 212, a phase of $HfF_4$ 214, and a phase of $HfO_2$ 216. From the diagram 200, it is observed that $HfO_2$ is stable (phase 216) when the pH of the system 210 is greater than 4.3 and the voltage potential of the system 210 is greater than −1.8 volts. That is, $HfO_2$ does not react with HF and remains stable in the system 210 when the pH is greater than about 4.3 and the voltage potential is greater than about −1.8 volts.

With respect to an $SiO_2$/HF system 220, there are four (4) phases that are shown in the diagram 200. The various phases of the $SiO_2$/HF system 220 include a phase of Si 222, a phase of $SiO_2$ 224, a phase of $SiF_6^{-2}$ 226, and another phase of $SiO_2$ 228. From the diagram 200, it is observed that $SiO_2$ is etched by HF in phase 226 ($SiF_6^{-2}$) when the pH of the system 220 is between about 1.9 to about 3.8 and voltage potential of the system 220 is greater than about −1.1 volts. In other words, $SiO_2$ may react with HF to form $SiF_6^{-2}$ when the pH is between about 1.9 to about 3.8 and voltage potential is greater than about −1.1 volts. From the above, there is no overlap between the phase 216 ($HfO_2$) of the system 210 and the phase 226 ($SiF_6^{-2}$) of system 220. Accordingly, the HF solution with an [F-] concentration of 0.01M does not have an etching selectivity of $SiO_2$ to $HfO_2$, and thus is not suitable to remove the hard mask layer 120 discussed in FIG. 1E.

However, it has been observed that the phase of $SiF_6^{-2}$ 226 in the $SiO_2$/HF system 220 becomes larger as the [F-] concentration increases in the system. That is, $SiO_2$ may react with HF in a wider range of pH and voltage potential values when the [F-] concentration is increased. The phase 226 may include a line 230 that shifts to the right (e.g., pH decreasing) and a line 240 that shifts to the left (e.g., pH decreasing) as the [F-] concentration increases. Thus, the HF solution can be properly tuned to provide a high etching selectivity of $SiO_2$ to $HfO_2$ as will be discussed below.

Figure 3:
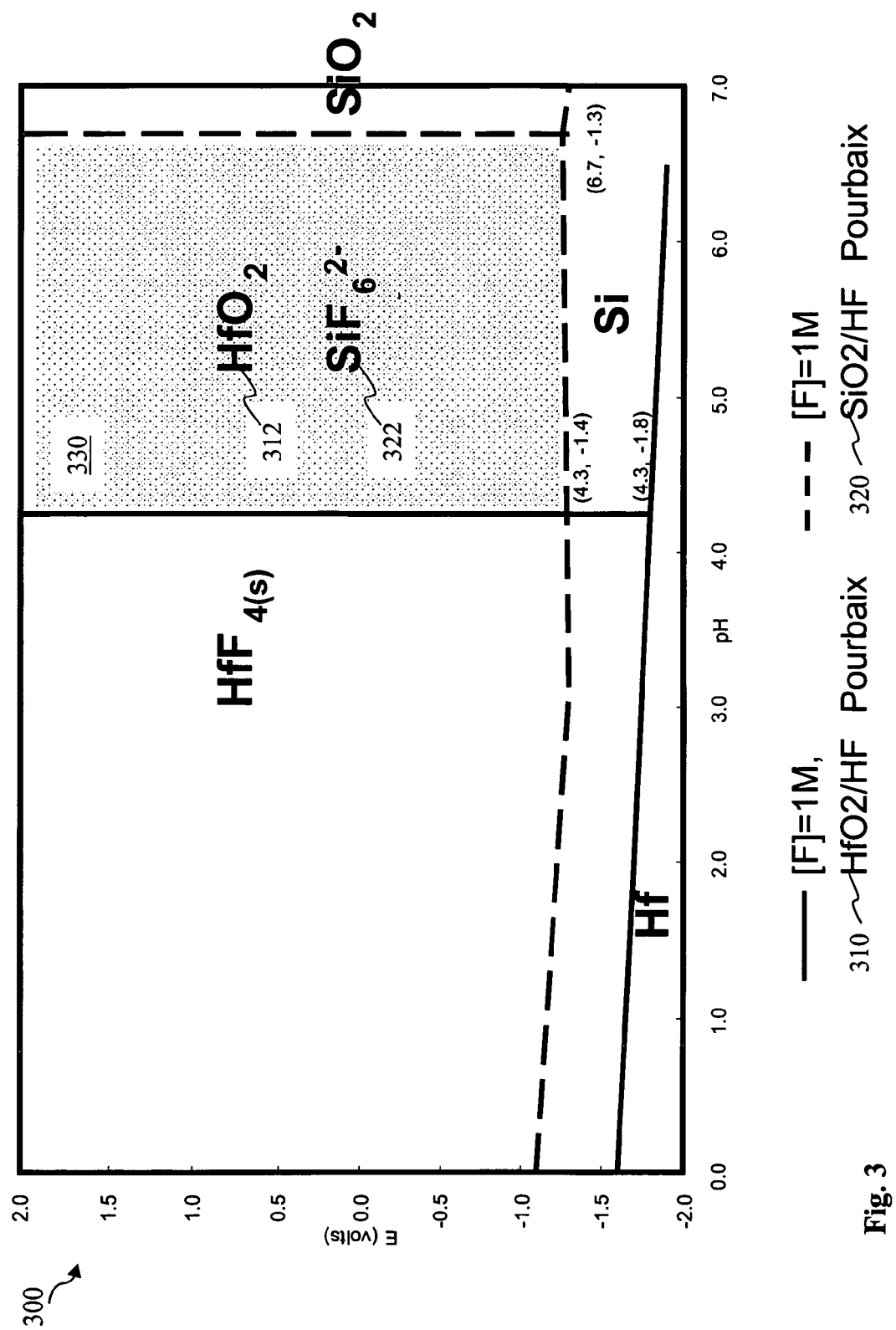
FIG. 3 is a pourbaix diagram illustrating various phases of $HfO_2$ and $SiO_2$, respectively, in HF solution with an [F-] concentration of 1.0M.

Referring to FIG. 3, illustrated is a pourbaix diagram 300 showing various phases of hafnium oxide ($HfO_2$) and silicon oxide ($SiO_2$), respectively, in an HF solution having an [F-] concentration of about 1.0M. The diagram 300 is similar to the diagram 200 of FIG. 2 except that the [F-] concentration has increased from 0.01M to 1.0M. With respect to an $HfO_2$/HF system 310, a phase of $HfO_2$ 312 occurs when the pH of the system 310 is greater than about 4.3 and the voltage potential of the system 310 is greater than about −1.8 volts. It should be noted that these parameters are substantially the same as in the $HfO_2$/HF system 210 (FIG. 2). With respect to an $SiO_2$/HF system 320, a phase of $SiF_6^{-2}$ 322 occurs when the pH of the system 320 is between about 4.3 and 6.7 and the voltage potential of the system 320 is greater than about −1.4 volts. An overlap region 330 between the phase 312 ($HfO_2$) of system 310 and the phase 322 ($SiF_6^{-2}$) of system 320 may represent the proper electrochemical characteristics of the HF solution that provide a high etching selectivity of $SiO_2$ to $HfO_2$. In other words, $HfO_2$ remains stable in HF and $SiO_2$ reacts with HF to form $SiF_6^{-2}$ in the overlap region 330. Thus, an etching solution having an [F-] concentration greater than 0.01M, a pH ranging from about 4.3 to about 6.7, and a voltage potential greater than about −1.4 volts can be used to selectively remove $SiO_2$ without damaging $HfO_2$ based high-k dielectric materials.

It has been observed that various mechanisms may be used to properly tune the etching solution. In some embodiments, an HF solution having an [F-] concentration greater than 0.01M may be provided (e.g., HF solution having [F-] concentration of 1.0M). A chemical component such as an alkaline solution or other suitable chemical solution is added to the HF solution to adjust the pH of the etching solution to range between 4.3 and 6.7 (e.g., pH of about 5). The alkaline solution may include, but is not limited to, NH$_4$OH, KOH, NaOH, (CH$_3$)$_4$NOH, or other cation+OH. A chemical component such as an oxidant or oxidizing agent is added to raise the voltage potential to be greater than −1.4 volts. The oxidant or oxidizing agent may include, but is not limited to, hydrogen peroxide (H$_2$O$_2$) or ozone in de-ionized water (DIO$_3$). It is understood that the amount of chemicals (e.g., alkaline solution and oxidant) added to the HF solution may vary depending on the pH of the original HF solution since this will effect the final pH and voltage potential values of the etching solution.

In some other embodiments, the voltage potential of the system can be increased electrically instead of chemically. For example, electrodes may be provided to the semiconductor device and a voltage potential may be supplied to the electrodes. The etching solution may be applied to the semiconductor device by dipping or other suitable process. Accordingly, a final voltage potential of the etching solution can be maintained to be greater than −1.4 volts during the etching process. Alternatively, electrodes may optionally be provided in the etching solution and a voltage potential supplied to the electrodes to achieve a final voltage potential of greater than −1.4 volts. The semiconductor device may then be dipped in the etching solution. It should be noted that examples of the chemical components and electrical components disclosed above may be substituted and/or modified so long as the proper concentration, pH value, and voltage potential of the etching solution are achieved. Further, the embodiments disclosed herein may be applicable for providing high etching selectivity with respect to other materials used in semiconductor manufacturing by analyzing pourbiax diagrams of the other materials in a manner similar to the one as discussed above.

Figure 4:
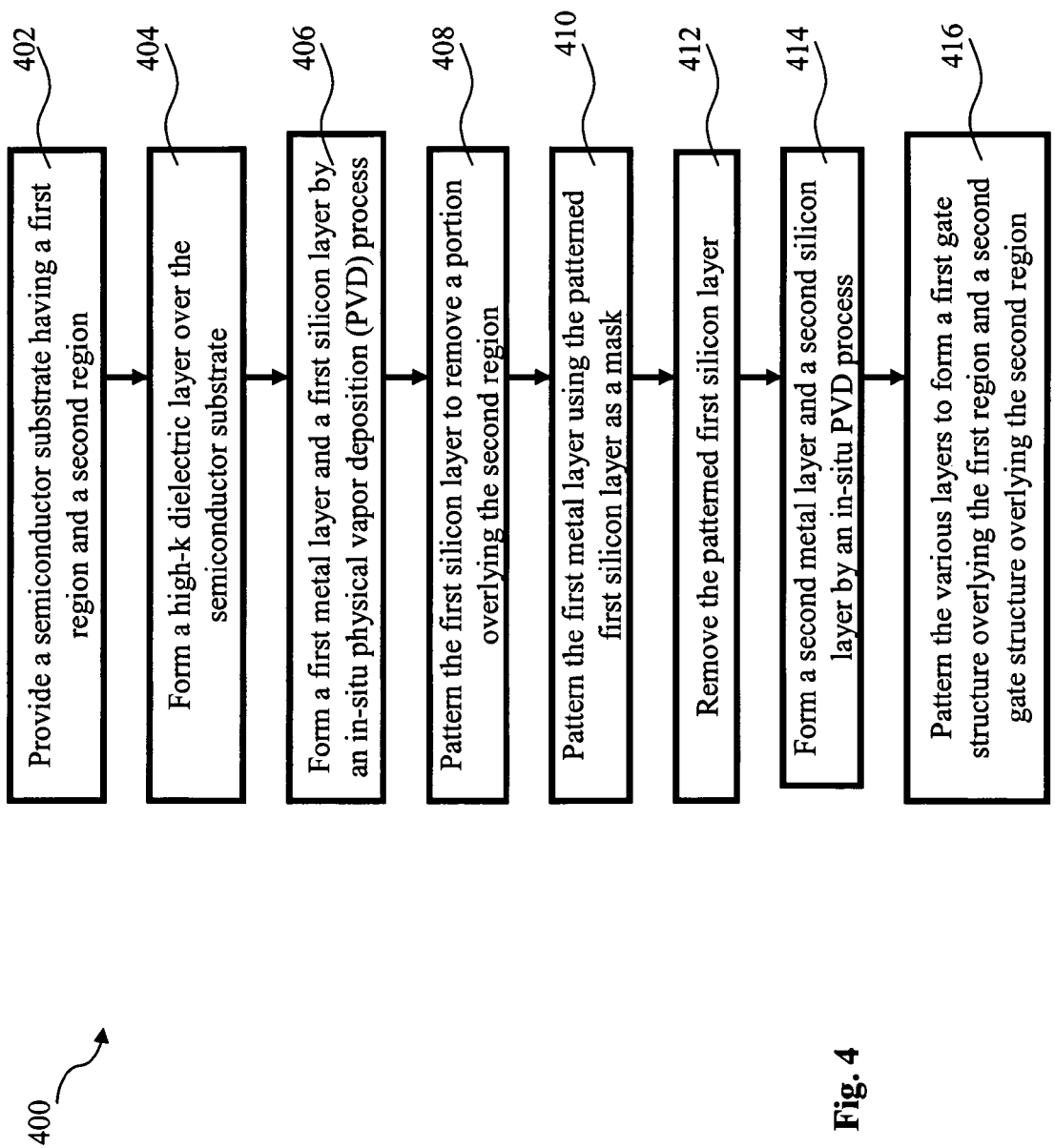
FIG. 4 is a flowchart illustrating a method for fabricating a semiconductor device with a high-k dielectric and metal gate according to various aspects of the present disclosure.

Referring to FIG. 4, illustrated is a flowchart of a method 400 for fabricating a semiconductor device having high-k dielectric and metal gate. Various aspects of the method 400 may be illustrated with reference to FIGS. 1-3. The method 400 begins with block 402 in which a semiconductor substrate having a first region and a second region is provided. The first and second regions may be configured for an NMOS or PMOS device. The method 400 continues with block 404 in which a high-k dielectric layer is formed over the semiconductor substrate. The method 400 continues with block 406 in which a first metal layer and a first silicon layer are formed by an in-situ PVD process. The first metal layer and the first silicon layer are formed over the high-k dielectric layer. The method 400 continues with block 408 in which the first silicon layer is patterned to remove a portion overlying the second region. The first silicon layer may be patterned by a photolithography process. The method 400 continues with block 410 in which the first metal layer is patterned using the patterned first silicon layer as a mask.

The method 400 continues with block 412 in which the patterned first silicon layer is removed. The first silicon layer may be removed by an etching process that includes using a properly tuned etching solution (similar to the one discussed above) to reduce the risk of damaging the high-k dielectric layer. The method 400 continues with block 414 in which a second metal layer and a second silicon layer are formed by an in-situ PVD process. The in-situ PVD processes in blocks 406 and 414 are similar. The method 400 continues with block 416 in which the various material layers are patterned to form a first gate structure overlying the first region and a second gate structure overlying the second region. The first and second gate structures may be formed by an etching process. It is understood that the method 400 continues with a CMOS process flow to form various features of the NMOS and PMOS devices as discussed above.

In summary, the methods and devices disclosed provide a effective approach to fabricate a semiconductor device with a high-k dielectric and metal gate. The methods and devices disclosed herein take advantage of an in-situ PVD process to form metal and silicon layers at different stages of fabrication. In some embodiments, the silicon layer may function as a hard mask for metal patterning. In other embodiments, the silicon layer may function as part of the gate electrode. The in-situ PVD process reduces the risk of oxidation of the metal and silicon layers, the risk of photoresist peeling, and the risk of metal substrate effects caused by forming silicon in a furnace process. The oxidation of the metal and silicon layers may adversely affect the work function (e.g., shifting) of the NMOS and PMOS devices and may also increase an effective oxide thickness (EOT) of the gate dielectric both of which may lead to poor device performance and reliability. Further, it has been observed that the in-situ PVD process is better suited than an in-situ CVD process due to silicon CVD defects such as silicon dendrite, silicon hump, and interface oxide on the metal layer. Additionally, the embodiments disclosed herein provide a properly tuned etching solution to remove the silicon hard mask after metal patterning without damaging the exposed high-k dielectric layer. Moreover, the methods and devices disclosed herein implement materials and processes that are friendly and compatible with a CMOS process flow, and that are inexpensive to incorporate with the process flow.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, although the embodiments disclosed herein illustrate a gate first process flow, the embodiments may also be advantageously implemented in a gate last process and a hybrid process that includes both a gate first and gate last process flows.

What is claimed is:

1. A method for fabricating a semiconductor device, comprising:
   providing a semiconductor substrate having a first region and a second region;
   forming a high-k dielectric layer over the semiconductor substrate;
   forming a first metal layer and a first silicon layer by an in-situ deposition process;
   patterning the first silicon layer to remove a portion overlying the second region;
   patterning the first metal layer using the patterned first silicon layer as a mask; and
   removing the patterned first silicon layer including applying a solution that includes:
   a first component having an [F-] concentration greater than 0.01M;
   a second component configured to adjust a pH of the solution, the pH ranging from about 4.3 to about 6.7; and a third component configured to adjust a potential of the solution, the potential being greater than −1.4 V;

wherein the solution is tuned by the first, second, and third components such that an exposed portion of the high-k dielectric layer is substantially not removed during the removal of the patterned first silicon layer.

2. The method of claim 1, wherein the high-k dielectric layer includes an hafnium oxide.

3. The method of claim 1, wherein the in-situ deposition process includes a physical vapor deposition (PVD) process in a vacuum platform.

4. The method of claim 3, wherein the first metal layer includes a TiN layer formed with a Ti target, a DC power not exceeding 1000 W, an RF power not exceeding 1000 W, Ar having a flow rate not exceeding 100 sccm, and N2 having a flow rate not exceeding 100 sccm.

5. The method of claim 3, wherein the first silicon layer is formed with an Si target, a DC power not exceeding 1000 W, an RF power not exceeding 1000 W, and Ar having a flow rate not exceeding 100 sccm.

6. The method of claim 1, wherein the solution removes a native oxide layer that forms on a top surface of the patterned first silicon layer.

7. The method of claim 1, further comprising, thereafter:
forming a second metal layer and a second silicon layer by an in-situ PVD process; and
patterning the various layers to form a first gate structure overlying the first region and a second gate structure overlying the second region.

8. The method of claim 7, wherein the second silicon layer includes a doped polysilicon layer.

9. An electrochemical system for use in fabricating a semiconductor device having a high-k dielectric and metal gate, comprising:
a first component having an [F-] concentration greater than 0.01M;
a second component configured to adjust a pH of the system, the pH ranging from about 4.3 to about 6.7; and
a third component configured to adjust a potential of the system, the potential being greater than −1.4 V;
wherein the system is tuned by the first, second, and third components such that the high-k dielectric is substantially not removed when exposed to the system.

10. The system of claim 9, wherein the first component includes hydrofluoric acid (HF).

11. The system of claim 10, wherein the first component has an [F-] concentration of about 1.0M.

12. The system of claim 9, wherein the second component includes an alkaline solution.

13. The system of claim 12, wherein the second component adjusts the pH of the etching solution to about 5.

14. The system of claim 9, wherein the third component includes an oxidizing agent.

15. An electrochemical system for use in fabricating a semiconductor device having a high-k dielectric and metal gate, comprising:
a first component having an [F-] concentration greater than 0.01M;
a second component configured to adjust a pH of the system, the pH ranging from about 4.3 to about 6.7; and
a third component configured to adjust a potential of the system, the potential being greater than −1.4 V, wherein the third component includes an electrode that supplies an electrical potential to the system.

16. A method for fabricating a semiconductor device, the method comprising:
providing a semiconductor substrate having a first region and a second region;
forming a high-k dielectric layer over the substrate;
forming a first metal layer and a first silicon layer by an in-situ PVD process;
removing a portion of the first silicon layer overlying the second region;
patterning the first metal layer using a remaining portion of the first silicon layer as a mask;
removing the remaining portion of the first silicon layer including applying a solution that is tuned to have electrochemical properties so as to substantially not remove an exposed portion of the high-k dielectric layer during the removal of the remaining portion of the first silicon layer;
forming a second metal layer and a second silicon layer by the in-situ PVD process; and
forming a first gate structure overlying the first region and a second gate structure overlying the second region.

17. The method of claim 16, wherein the first silicon layer includes a thickness not exceeding 100 angstrom.

18. The method of claim 16, wherein the second silicon layer includes a doped polysilicon layer.

19. The method of claim 16, wherein removing a portion of the first silicon layer overlying the second region includes:
forming a photoresist layer to protect the first silicon layer overlying the first region;
etching the portion of the first silicon layer overlying the second region using the photoresist layer as a mask.

20. The method of claim 19, further comprising removing the photoresist layer by one of:
performing a dry ashing process with $N_2/H_2$ gases; and
performing a stripping process with a reducing solvent.

21. The method of claim 16, wherein the solution includes:
a first component having an [F-] concentration greater than 0.01M;
a second component configured to adjust a pH of the system, the pH ranging from about 4.3 to about 6.7; and
a third component configured to adjust a potential of the system, the potential being greater than −1.4 V.

* * * * *